United States Patent
Späth et al.

(10) Patent No.: US 7,177,069 B2
(45) Date of Patent: Feb. 13, 2007

(54) WHITE LIGHT SOURCE BASED ON NONLINEAR-OPTICAL PROCESSES

(75) Inventors: Werner Späth, Holzkirchen (DE); Rüdiger Müller, Regenstauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 873 days.

(21) Appl. No.: 10/186,649

(22) Filed: Jul. 1, 2002

(65) Prior Publication Data

US 2003/0006382 A1    Jan. 9, 2003

Related U.S. Application Data

(63) Continuation of application No. PCT/DE00/03957, filed on Nov. 10, 2000.

(30) Foreign Application Priority Data

Dec. 30, 1999   (DE)   ............................... 199 63 805

(51) Int. Cl.
    G02F 1/35    (2006.01)
    G02F 1/39    (2006.01)
(52) U.S. Cl. .............................. 359/326; 359/330
(58) Field of Classification Search ......... 359/326–332
    See application file for complete search history.

(56) References Cited

U.S. PATENT DOCUMENTS

| | | | |
|---|---|---|---|
| 4,952,013 A | 8/1990 | Harada et al. ............... 359/328 |
| 5,233,462 A * | 8/1993 | Wong ........................ 359/330 |
| 5,295,143 A | 3/1994 | Rao et al. ..................... 372/22 |
| 5,400,173 A * | 3/1995 | Komine ...................... 359/330 |
| 5,640,405 A * | 6/1997 | Wallace et al. ............... 372/21 |
| 5,787,102 A * | 7/1998 | Alexander et al. ........... 372/22 |
| 5,894,489 A | 4/1999 | Halldorsson et al. ......... 372/23 |
| 5,923,683 A * | 7/1999 | Morioka et al. ............... 372/6 |
| 6,163,038 A | 12/2000 | Chen et al. ................. 257/103 |
| 6,233,089 B1 | 5/2001 | Nebel ......................... 359/330 |
| 6,812,500 B2 * | 11/2004 | Reeh et al. .................... 257/98 |

FOREIGN PATENT DOCUMENTS

| | | |
|---|---|---|
| DE | 38 04 293 A1 | 8/1989 |
| DE | 195 04 047 C1 | 7/1996 |
| DE | 195 10 423 A1 | 9/1996 |
| DE | 196 38 667 A1 | 4/1998 |
| EP | 0 683 595 A2 | 11/1995 |

(Continued)

OTHER PUBLICATIONS

Mütze. K. et al.: "ABC der Optik" [ABC of optics]. Verlag Werner Dausien, 1961, pp. 268-269, no month.

(Continued)

Primary Examiner—John D. Lee
(74) Attorney, Agent, or Firm—Laurence A. Greenberg; Werner H. Stemer; Ralph E. Locher

(57) ABSTRACT

A white light source has a light emission device, in particular an IR laser diode, whose emitted radiation beam is converted, in a nonlinear-optical element and a conversion element, into a radiation beam with wavelengths $\lambda_1, \ldots \lambda_n$ which can be perceived as white light and can have a higher power rating.

30 Claims, 2 Drawing Sheets

FOREIGN PATENT DOCUMENTS

| | | |
|---|---|---|
| EP | 0 767 396 A2 | 4/1997 |
| EP | 0 788 015 A2 | 8/1997 |
| JP | 1244434 | 9/1989 |
| JP | 3003377 | 1/1991 |
| JP | 10163535 | 6/1998 |
| JP | 11135838 | 5/1999 |
| JP | 11-512198 | 10/1999 |
| WO | WO 97/50132 | 12/1997 |
| WO | WO 98/12757 | 3/1998 |
| WO | WO 98/26328 | 6/1998 |
| WO | WO 98/54929 | 12/1998 |

OTHER PUBLICATIONS

Haferkorn, H: Lexikon der Optic 1988, Verlag Werner Dausien-Hanau, p. 130, no month.

* cited by examiner

WHITE LIGHT SOURCE BASED ON NONLINEAR-OPTICAL PROCESSES

CROSS-REFERENCE TO RELATED APPLICATION

This application is a continuation of copending International Application No. PCT/DE00/03957, filed Nov. 10, 2000, which designated the United States and was not published in English.

BACKGROUND OF THE INVENTION

Field of the Invention

In particular, the present invention relates to a white light source in which a light emission device emits light radiation in a relatively long-wave, i.e. red or infrared, spectral region, which is converted by nonlinear-optical processes into an output radiation whose spectral constituents are essentially complementarily colored, so that the output radiation appears as white light.

A white light source based on a semiconductor LED is disclosed for example in the Published, Non-Prosecuted German Patent Application DE 38 04 293 A, which describes a configuration having an electroluminescent or laser diode in which the emission spectrum radiated by the diode is shifted toward longer wavelengths by a plastic element treated with a phosphorescent, light-converting organic dye. The light radiated by the configuration consequently has a different color from the light emitted by the light-emitting diode. Depending on the nature of the dye added to the plastic, light-emitting diode configurations which emit light in different colors can be produced using one and the same type of light-emitting diode.

In many potential areas of application for light-emitting diodes, such as for example, in display elements in motor vehicle dashboards lighting in aircraft and automobiles, and in full-color LED displays, there is increasingly a demand for light-emitting diode configurations with which polychromatic light, in particular white light, can be produced.

International Patent Disclosure WO 98/12757 describes a wavelength-converting potting compound for an electroluminescent component having a body which emits ultraviolet, blue or green light, based on a transparent epoxy resin treated with a luminescent material, in particular with an inorganic luminescent material pigment powder with luminescent material pigments from the group of phosphors. As a preferred exemplary embodiment, a description is given of a white light source in which a radiation-emitting semiconductor LED is based on GaN, GaInN, GaAlN or GaInAlN with an emission maximum of between 420 nm and 460 nm is combined with a luminescent material which is chosen such that a blue light radiation emitted by the semiconductor body is converted into complementary wavelength ranges, in particular blue and yellow, or to form additive color triads, e.g. blue, green and red. In this case, the yellow or the green and red light is generated by the luminescent materials. The hue (color locus in the CIE chromaticity diagram) of the white light generated in this way can be varied in this case by a suitable choice of the luminescent material or materials with regard to mixture and concentration.

Likewise, International Patent Disclosure WO 98/54929 discloses a visible-light-emitting semiconductor component having a UV/blue LED which is disposed in a depression of a carrier body, whose surface has a light-reflecting layer and is filled with a transparent material which surrounds the LED at its light exit side. In order to improve the coupling-out of light, the transparent material has a refractive index that is lower than the refractive index of the light-active region of the LED.

International Patent Disclosure WO 97/50132 discloses a light-radiating semiconductor component having a radiation-emitting semiconductor body and a luminescence conversion element. The semiconductor body emits radiation in the ultraviolet blue and/or green spectral region and the luminescence conversion element converts part of the radiation into radiation having a longer wavelength, as a result of which it is possible to reduce light-emitting diodes which radiate polychromatic light, in particular white light, by a single light-emitting semiconductor body. Cerium-doped yttrium-aluminum garnet (YAG:Ce) is described as a particularly preferred luminescence conversion substance.

The known configurations have the disadvantage, however, that—as described—they can only be operated with a light-emitting diode or laser diode which emits in the blue or ultraviolet spectral region. These light emitters are usually produced on the basis of GaN or II–VI compounds such as Zns/Se, and the attainable light powers are a few 10 mW.

SUMMARY OF THE INVENTION

It is accordingly an object of the invention to provide a white light source based on nonlinear-optical processes that overcomes the above-mentioned disadvantages of the prior art devices of this general type, which can be routinely produced in particular for higher light powers in the watts and multiwatts range with high reliability and long service life. In particular, it is an object of the present invention to specify a white light source having a laser diode, in particular an infrared laser diode based on III–V compounds, such as e.g. GaAlAs, GaInAlAs, GaInAs or, which emits only in the fundamental mode.

With the foregoing and other objects in view there is provided, in accordance with the invention, a white light source. The white light source contains a light emission device for emitting a radiation beam with at least one radiation frequency in a red spectral region or an infrared spectral region, and a nonlinear-optical element disposed downstream of the light emission device and into the non-linear-optical element the radiation beam is coupled and converted into a frequency-mixed radiation beam at least partially by generation of at least one mixed frequency by frequency mixing, frequency doubling, summation frequency formation, and/or difference frequency formation. A conversion element is disposed downstream of the nonlinear-optical element and into the conversion element the frequency-mixed radiation beam is coupled and converted at least partially into light radiation of longer wavelengths or shorter wavelengths in such a way that an emission spectrum of the radiation beam radiated by the conversion element has mutually complementarily colored spectral regions. The color spectral region can be red, green and blue.

In this case, the conversion element is understood to mean generally an element that converts at least part of a radiation field of a first wavelength range into a second wavelength range. The conversion can be effected by absorption and reemission of the radiation field. As an alternative, a conversion by a nonlinear optical process that, if appropriate, may also be resonance-amplified is possible. In particular, this includes luminescence, summation and difference frequency generation, especially the generation of harmonic and subharmonic frequencies, Raman scattering and stimulated Raman scattering.

Instead of complementarily colored spectral regions, the radiation beams radiated by the conversion element may also have components in the red, green and blue spectral region, which can likewise be made to form white light.

Consequently, the basic principle of the invention consists in using a conventional light source such as an infrared laser diode based on III-V semiconductor material and in converting the light radiation emitted by the light source into white light by nonlinear-integral processes.

In a first embodiment, the nonlinear-optical crystal is configured in such a way that it either acts as frequency doubler for an individual radiation frequency or that it can generate the summation frequency from a plurality of different radiation frequencies of the light emission device, the conversion element being a luminescence conversion element. Either an organic dye or an inorganic luminescent material, in particular a phosphor such as cerium-doped YAG, for example, may be used for the element.

In the simplest case, the nonlinear-optical crystal is thus a conventional frequency doubler which generates the second harmonic from an individual radiation frequency contained in the emitted radiation beam. However, the nonlinear-optical crystal may also additionally have the property that it generates a summation frequency from two or else more different radiation frequencies of the emitted radiation beam.

The light emission device is preferably a laser beam source, since the beam intensity of the radiation beam coupled to the nonlinear-optical crystal plays an important part for efficient frequency doubling or frequency mixing. The doubling efficiency $\eta$ exhibits the following behavior: $\eta \sim I^2$, i.e. it rises with the square of the radiated-in light intensity I=P/A (P=light power, A=area,). Therefore, it may also be advantageous to operate the light emission device in a pulsed manner, since e.g. a doubling of the pulse height already results in a quadrupling of the doubling efficiency.

The laser beam source is preferably a solid-state laser. An appropriate laser of this type is, of course, a laser diode, that is to say, in the present case, the laser diode that emits in the red or infrared spectral region. In this case, it is possible to use in particular the so-called vertical resonator laser diodes (VCSELs), which have only little beam divergence and whose beams can be collimated with a microlens array. These or else other types of laser diodes can be disposed in an array lying opposite a lamina made of a nonlinear-optical crystal, so that each laser diode emits a radiation beam which passes through the nonlinear-optical crystal lamina at a dedicated location in each case. On the opposite surface of the nonlinear-optical crystal lamina, the conversion element, that is to say a luminescent material for example, can be applied directly or be disposed at a distance therefrom.

However, it is also possible to use another solid-state laser, such as an Nd:YAG laser, for example.

The material of the nonlinear-optical element may be selected from the group $KH_2PO_4$, $KNbO_3$, $BaNaNbO_{15}$ (banana crystal), $LiIO_3$, $KTiOPO_4$, (KTP), $LiNbO_3$ (lithium niobate), $LiB_3O_5$ (LBO) or $\beta$-$BaB_2O_4$ (BBO) or another nonlinear-optical crystal material.

The conversion element is a conversion element in the first embodiment. In this case, a luminescent material, that is to say in the broadest sense a phosphor, is preferably used. If the radiation beam leaving the nonlinear-optical crystal essentially lies in the blue spectral region, then, in particular, the use of cerium-doped yttrium-aluminum garnet (YAG: Ce) is particularly advantageous since the phosphor converts the blue light into yellow light particularly efficiently, so that such a partial conversion generates a mixture of blue and yellow light which produces the physiological impression of a white light source to a particularly satisfactory extent.

In a second embodiment, the nonlinear-optical crystal is an optical-parametric oscillator (OPO) and the conversion element is a second nonlinear-optical element that is capable of frequency doubling and summation frequency generation. The second embodiment thus describes the opposite route to the first embodiment, since longer wavelengths are generated from the excitation wavelength in the OPO crystal ("down-conversion") and only in a second step are shorter wavelengths generated again in the second nonlinear-optical element ("up-conversion").

In this embodiment, too, the light emission devices already mentioned in the first embodiment can be used and the materials already mentioned there can be used for the nonlinear-optical elements.

Other features which are considered as characteristic for the invention are set forth in the appended claims.

Although the invention is illustrated and described herein as embodied in a white light source based on nonlinear-optical processes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
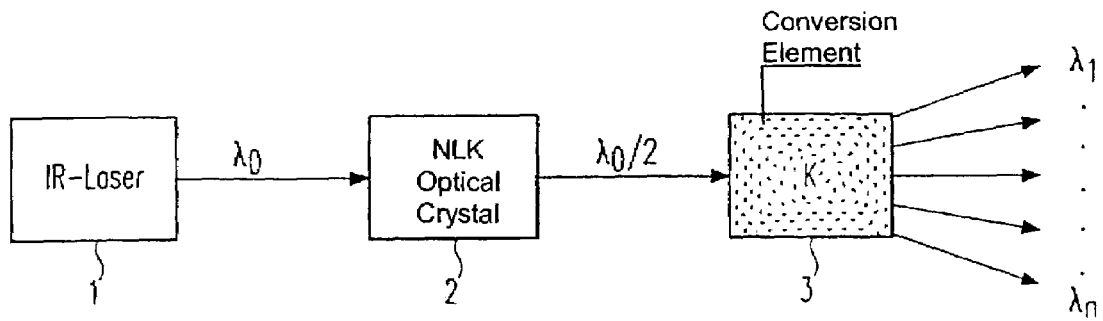
FIG. 1 is a block diagram of a first embodiment of a white light source in accordance with the invention.

Referring now to the figures of the drawing in detail and first, particularly, to FIG. 1 thereof, there is shown a diagrammatic illustration of a first embodiment showing a light emission device 1, in the present case an infrared (IR) laser, in particular an IR laser diode, which has a preferably narrowband emission spectrum with a maximum at a wavelength $\lambda_0$. What is appropriate for the case where a laser diode is used is, for example, a vertical resonator laser diode (VCSEL), which, as is known, is surface emitting and emits a relatively weakly divergent beam. In this case, it is also possible to form a plurality of VCSELs as an array on a common semiconductor substrate, over which a microlens array for collimating the beams is fitted. However, it is also possible to use another solid-state laser, for example an Nd:YAG laser, which emits at a wavelength of 1064 nm.

The light emission device 1 is preferably operated in a pulsed manner since the efficiency of the processes essential to the invention, such as frequency doubling or summation or difference frequency generation are proportional to the square of the light power.

The radiation beam emitted by the light emission device 1 with the primary maximum at the wavelength $\lambda_0$ is fed to a nonlinear-optical crystal 2, in which, in the present embodiment, in the simplest case, a frequency doubling is carried out, which may be effected for example by a known type II phase matching. Accordingly, the nonlinear-optical crystal 2 generates a radiation beam with an emission maximum at a wavelength $\lambda_0/2$. All currently known types can be used as material for the nonlinear-optical crystal 2. Preferred materials are $KH_2PO_4$, (KDP), $KNbO_3$, (potassium niobate) $BaNaNbO_{15}$ (banana crystal), $LiIO_3$, $KTiOPO_4$, (KTP), $LiNbO_3$ (lithium niobate), $LiB_3O_5$ (LBO) or $\beta\text{-}BaB_2O_4$ (BBO).

If the IR laser diode emits for example at a wavelength $\lambda_0=920$ nm, then the nonlinear-optical crystal 2 generates a signal at the second harmonic, i.e. a wavelength $\lambda_0/2=460$ nm. In this way, the IaGaN light-emitting or laser diode that is usually used in white light sources of this type can be replaced by the IR laser diode and the nonlinear-optical crystal 2.

The frequency-doubled radiation is then applied to a conversion element 3 in a manner known per se, which conversion element generates an output radiation with wavelengths $\lambda_1 \ldots \lambda_n$ having mutually complementarily colored spectral regions. The wavelengths $\lambda_1 \ldots \lambda_n$ may thus lie for example, in the blue and yellow spectral regions or they may be formed by a color triad in the red, green and blue spectral region. In both cases, white light is generated by the additive mixing of the colors.

In the present embodiment, the conversion element 3 is a luminescent conversion element. The latter may be formed on the one hand by organic dye molecules that are embedded in a suitable matrix. On the other hand, it may be formed by an inorganic luminescent material such as a phosphor. Cerium-doped yttrium-aluminum garnet (YAG:Ce) is particularly preferred in this regard since, as is known, it enables an efficient conversion from blue to yellow light. In this case, part of the blue light entering into the conversion element 3 on the input side would pass through unhindered and mix with the converted yellow light to form white light.

The conversion element 3 may also be formed by a semiconductor material or by a layer system made of different semiconductor materials.

It is equally conceivable for the radiation beam emitted by the light emission device 1 to have a plurality of radiation frequencies and for a summation frequency to be generated in the nonlinear-optical crystal 2.

Thus, in the first embodiment described above, in a first step, first an up-conversion of the supplied light radiation is performed in the nonlinear-optical crystal 2, while afterward, in a second step, the up-converted light radiation is distributed, in the conversion element 3, between mutually complementarily colored wavelengths in such a way that white light is generated as a result.

Figure 2:
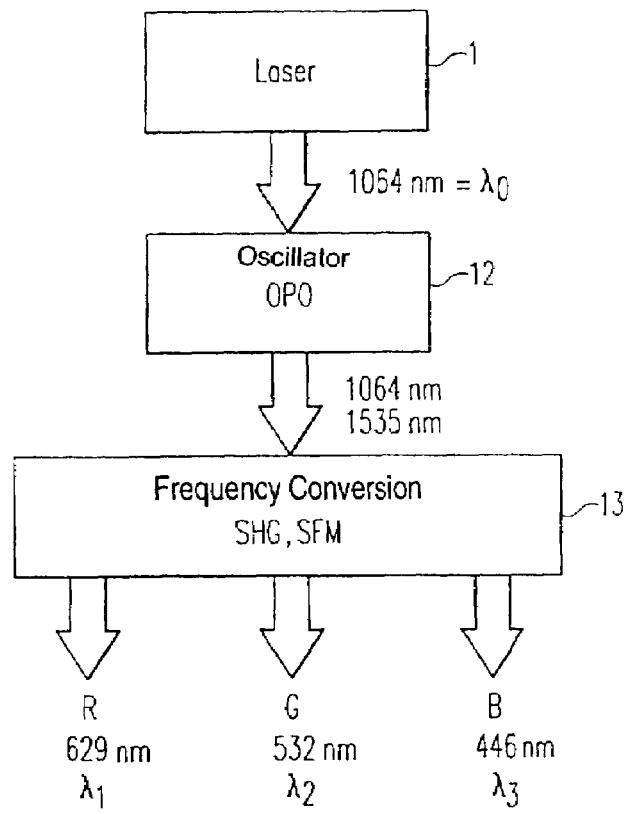
FIG. 2 is a block diagram of a second embodiment of the white light source in accordance with the invention.

The second embodiment of the present invention, which is illustrated in FIG. 2, takes the opposite route, as it were, in that in this case wavelengths which are longer than the output wavelength are generated by down-conversion and then the wavelengths are up-converted by frequency doubling and summation frequency formation.

In order, use is made, in the second embodiment, too, of the light emission device 1, in the present case an Nd:YAG laser, which generates a wavelength of $\lambda_0=1064$ nm. In the present embodiment, the nonlinear-optical element is formed by an optical-parametric oscillator (OPO) 12. In the latter, in a manner known per se, the input radiation at the wavelength $\lambda_0=1064$ nm is split into sub-beams with the wavelengths 1535 nm and 3468 nm. The resonator mirrors of the OPO crystal 12, i.e. generally the mirrored surfaces of the OPO crystal are chosen in such a way with regard to their wavelength selectivity that, in the present exemplary embodiment, the wavelength 3468 nm experiences no amplification within the resonator and the resonator mirrors have a high reflectivity only at the wavelength 1535 nm. Consequently, only the pump wavelength 1064 nm and the wavelength 1535 nm generated by it pass through the OPO crystal 12.

In the present case of the second embodiment, the conversion element 13 is a second nonlinear-optical crystal in which a frequency doubling and summation frequency generation of the wavelengths of the radiation emitted by the OPO crystal 12 is carried out. In the present exemplary embodiment, a first wavelength $\lambda_1=629$ nm is generated by summation frequency formation of the two wavelengths 1064 nm and 1535 nm of the input radiation. A second wavelength $\lambda_2=532$ nm is generated by frequency doubling of the first-mentioned wavelength. A third wavelength $\lambda_3=446$ nm is generated by summation frequency formation from the first-mentioned wavelength with the frequency-doubled second-mentioned wavelength.

In this way, three complementarily colored wavelengths are generated, namely red, green and blue, whose additive color mixing yields white light.

In the second embodiment, too, a laser diode such as a VCSEL can be used as light emission device.

Figure 3:
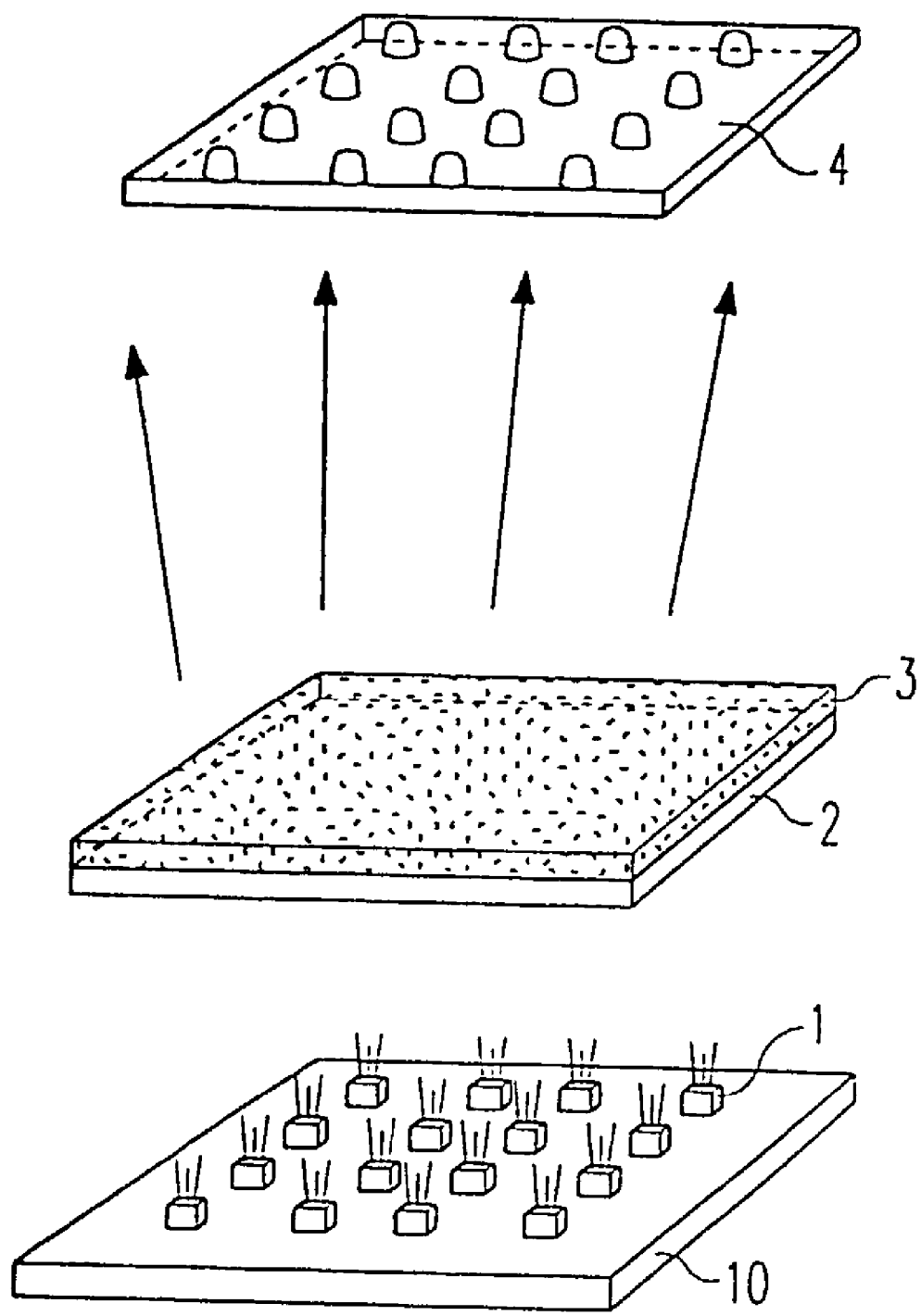
FIG. 3 an exploded, diagrammatic perspective view of a practical exemplary embodiment of the white light source according to the invention using an array of light emission devices in accordance with the invention.

Finally, FIG. 3 additionally illustrates a practical embodiment for a white light source according to the invention. In the latter, a plurality of light emission devices 1 disposed in a matrix-like manner, in particular vertical resonator laser diodes (VCSEL), are formed on a semiconductor substrate 10 and emit radiation beams in the infrared spectral region with the aid of micro lenses. In the radiation direction of the laser diodes, there is disposed first a nonlinear-optical crystal 2, for example in the form of $LiNb_3$ lamina, which generates the second harmonic of the emitted radiation beams. Preferably, a lens configuration is additionally made between the laser diodes and the lithium niobate lamina, which lens configuration contains a matrix-like multiplicity of individual lenses by which each of the radiation beams is optimally focused onto a respective dedicated location of the lithium niobate lamina. Efficient frequency doubling requires that the wavefronts of the radiation beams be as planar as possible in the plane of the lithium niobate lamina.

The conversion element 3, in particular a luminescent conversion element 3, is applied to that surface of the lithium niobate lamina which is remote from the laser diodes. The element may contain, for example, a luminescent material such as a phosphor. The latter is preferably dispersed in the form of luminescent material particles in a transparent embedding compound that has been applied on the lithium niobate lamina. As an alternative to this, the conversion element 3 may also be disposed separately from the nonlinear-optical crystal 2. Finally, a further lens, in particular a fresnel lens, may additional be provided in order to project the generated white light into infinity.

Disposed above the lithium niobate lamina is a microlens array 4, which has a matrix-like configuration of individual microlenses that are each assigned to individual laser diodes.

The practical exemplary embodiment illustrated can also be formed by the second embodiment. In this case, the nonlinear-optical crystal 2 is formed by an OPO crystal and the conversion element 3 is formed by a second linear-optical crystal.

We claim:

1. A white light source, comprising:
   a light emission device for emitting a radiation beam with at least one radiation frequency in one of a red spectral region and an infrared spectral region;
   a nonlinear-optical element disposed downstream of said light emission device and into said nonlinear-optical element the radiation beam is coupled and converted into a frequency-mixed radiation beam at least partially by generation of at least one mixed frequency by at least one of frequency mixing, frequency doubling, summation frequency formation, and difference frequency formation; and
   a luminescence conversion element disposed downstream of said nonlinear-optical element and into said luminescence conversion element the frequency-mixed radiation beam is coupled and converted at least partially into light radiation of one of longer wavelengths and shorter wavelengths in such a way that an emission spectrum of the radiation beam radiated by said luminescence conversion element has mutually complementarily colored spectral regions.

2. The white light source according to claim 1, wherein said nonlinear-optical element is configured in such a way that said nonlinear-optical element acts as a frequency doubler for an individual radiation frequency.

3. The white light source according to claim 1, wherein said luminescence conversion element is selected from the group consisting of an organic dye conversion element, an inorganic luminescent material conversion element, and a semiconductor conversion element.

4. The white light source according to claim 1, wherein said nonlinear-optical element is an optical-parametric oscillator.

5. The white light source according to claim 1, wherein said light emission device is a solid state laser.

6. The white light source according to claim 5, wherein said solid-state laser is selected from the group consisting of edge-emitting laser diodes and vertical resonator laser diodes made of a material selected from the group consisting of GaAlAs, InGaAlAs, InGaAs and InGaAlP.

7. The white light source according to claim 5, wherein said solid-state laser is an Nd:YAG laser.

8. The white light source according to claim 1, wherein said light emission device can be used for a pulsed operation.

9. The white light source according to claim 1, wherein said nonlinear-optical element has a material selected from the group consisting of $KH_2PO_4$, $KNbO_3$, $BaNaNbO_{15}$, $LiIO_3$, $KTiOPO_4$ (KTP), $LiNbO_3$, $LiB_3O_5$, and $\beta$-$BaB_2O_4$.

10. The white light source according to claim 1, further comprising a common substrate, and said light emission device is one of a plurality of light emission devices disposed on said common substrate.

11. The white light source according to claim 10, wherein said light emission devices are vertical resonator laser diodes formed on said common substrate being a common semiconductor substrate.

12. The white light source according to claim 10, wherein said light emission devices emit radiation beams that pass through a respective location of said nonlinear-optical element.

13. The white light source according to claim 12, wherein said luminescence conversion element is applied directly on a surface of said nonlinear-optical element which is remote from said light emission devices.

14. The white light source according to claim 3, wherein said inorganic luminescent material conversion element uses phosphor.

15. The white light source according to claim 1, wherein said nonlinear-optical element is configured in such a way that said nonlinear-optical element generates a summation frequency from a plurality of different radiation frequencies of said light emission device.

16. A white light source, comprising:
    a light emission device for emitting a radiation beam with at least one radiation frequency in one of a red spectral region and an infrared spectral region;
    a nonlinear-optical element disposed downstream of said light emission device and into said nonlinear-optical element the radiation beam is coupled and converted into a frequency mixed radiation beam at least partially by generation of at least one mixed frequency by at least one of frequency mixing, frequency doubling, summation frequency formation, and difference frequency formation; and
    a luminescence conversion element disposed downstream of said nonlinear-optical element and into said luminescence conversion element the frequency-mixed radiation beam is coupled and converted at least partially into light radiation of one of longer wavelengths and shorter wavelengths in such a way that an emission spectrum of the radiation beam radiated by said luminescence conversion element has spectral components in a red, green and blue spectral region.

17. The white light source according to claim 16, wherein said nonlinear-optical element is configured in such a way that said nonlinear-optical element acts as a frequency doubler for an individual radiation frequency.

18. The white light source according to claim 16, wherein said luminescence conversion element is selected from the group consisting of an organic dye conversion element, an inorganic luminescent material conversion element, and a semiconductor conversion element.

19. The white light source according to claim 16, wherein said nonlinear-optical element is an optical-parametric oscillator.

20. The white light source according to claim 16, wherein said light emission device is a solid state laser.

21. The white light source according to claim 20, wherein said solid-state laser is selected from the group consisting of edge-emitting laser diodes and vertical resonator laser diodes made of a material selected from the group consisting of GaAlAs, InGaAlAs, InGaAs and InGaAlP.

22. The white light source according to claim 20, wherein said solid-state laser is an Nd:YAG laser.

23. The white light source according to claim 16, wherein said light emission device can be used for a pulsed operation.

24. The white light source according to claim 16, wherein said nonlinear-optical element has a material selected from the group consisting of $KH_2PO_4$, $KNbO_3$, $BaNaNbO_{15}$, $LiIO_3$, $KTiOPO_4$ (KTP), $LiNbO_3$, $LiB_3O_5$ and $\beta$-$BaB_2O_4$.

25. The white light source according to claim 16, further comprising a common substrate, and said light emission device is one of a plurality of light emission devices disposed on said common substrate.

26. The white light source according to claim 25, wherein said light emission devices are vertical resonator laser diodes formed on said common substrate being a common semiconductor substrate.

27. The white light source according to claim 25, wherein said light emission devices emit radiation beams that pass through a respective location of said nonlinear-optical element.

28. The white light source according to claim 27, wherein said luminescence conversion element is applied directly on a surface of said nonlinear-optical element which is remote from said light emission devices.

29. The white light source according to claim 18, wherein said inorganic luminescent material conversion element uses phosphor.

30. The white light source according to claim 16, wherein said nonlinear-optical element is configured in such a way that said nonlinear-optical element generates a summation frequency from a plurality of different radiation frequencies of said light emission device.

* * * * *